(12) United States Patent
Cho

(10) Patent No.: US 7,393,489 B2
(45) Date of Patent: Jul. 1, 2008

(54) MOLD DIE FOR MOLDING CHIP ARRAY, MOLDING EQUIPMENT INCLUDING THE SAME, AND METHOD FOR MOLDING CHIP ARRAY

(75) Inventor: Chang-Ho Cho, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 467 days.

(21) Appl. No.: 10/772,242

(22) Filed: Feb. 6, 2004

(65) Prior Publication Data

US 2004/0155362 A1 Aug. 12, 2004

(30) Foreign Application Priority Data

Feb. 8, 2003 (KR) .................... 10-2003-0008010

(51) Int. Cl.
*B29C 45/14* (2006.01)
*H01L 21/56* (2006.01)
(52) U.S. Cl. .................. 264/272.17; 425/116; 425/127; 425/129.1; 425/562; 438/127
(58) Field of Classification Search ............. 425/116, 425/127, 129.1, 562; 264/272.17; 438/112, 438/127
See application file for complete search history.

(56) References Cited

U.S. PATENT DOCUMENTS

| | | | | |
|---|---|---|---|---|
| 2,766,482 A | * | 10/1956 | Heibel | 425/121 |
| 4,812,420 A | * | 3/1989 | Matsuda et al. | 438/65 |
| 5,079,190 A | * | 1/1992 | Mihara | 438/26 |
| 5,356,283 A | * | 10/1994 | Hamada et al. | 425/544 |
| 5,517,056 A | * | 5/1996 | Bigler et al. | 257/666 |
| 5,594,274 A | * | 1/1997 | Suetaki | 257/667 |
| 5,645,864 A | * | 7/1997 | Higuchi | 425/116 |
| 5,750,153 A | * | 5/1998 | Shibata | 425/116 |
| 5,961,912 A | * | 10/1999 | Huang et al. | 264/272.15 |
| 6,104,085 A | * | 8/2000 | Muto et al. | 257/675 |
| 6,469,369 B1 | * | 10/2002 | Lee | 257/670 |
| 6,642,610 B2 | * | 11/2003 | Park et al. | 257/678 |
| 6,717,248 B2 | * | 4/2004 | Shin et al. | 257/678 |
| 6,750,533 B2 | * | 6/2004 | Wang et al. | 257/667 |

(Continued)

FOREIGN PATENT DOCUMENTS

JP 04249121 A * 9/1992

(Continued)

OTHER PUBLICATIONS

Partial machine translation of JP 10-138,294 A obtained from the JPO website.*

*Primary Examiner*—Robert B Davis
(74) *Attorney, Agent, or Firm*—Harness, Dickey & Pierce, P.L.C.

(57) ABSTRACT

Provided are a mold die for molding a chip array, molding equipment including such a mold die and a molding method utilizing such molding equipment. The mold die provides for the selective injection of mold resin through a corner gate controlled by a gate block whereby the flow of the mold resin is neither perpendicular nor parallel to the side surfaces of the semiconductor chips arranged in the chip array. In this manner failures associated with the sweeping effects of the mold resin flowing past the bonding wires on the semiconductor chips may be reduced.

18 Claims, 11 Drawing Sheets

U.S. PATENT DOCUMENTS 6,897,093 B2 * 5/2005 Kasuga et al. ................ 438/112
2002/0033523 A1 * 3/2002 Cigada et al. ................ 257/666

FOREIGN PATENT DOCUMENTS

| JP | 08097344 A * | 4/1996 |
| JP | 09-327844 | 12/1997 |
| JP | 10-138294 | 5/1998 |
| JP | 11176855 A * | 7/1999 |
| JP | 11333882 A * | 12/1999 |
| JP | 2002-319595 | 10/2002 |
| KR | U1996-0038721 | 12/1996 |
| KR | 0157898 | 12/1998 |

* cited by examiner

MOLD RESIN FLOW BOUNDARY

MOLD DIE FOR MOLDING CHIP ARRAY, MOLDING EQUIPMENT INCLUDING THE SAME, AND METHOD FOR MOLDING CHIP ARRAY

This application claims priority from Korean Patent Application No. 10-2003-0008010, filed on Feb. 8, 2003, in the Korean Intellectual Property Office (KIPO), the entire contents of which are incorporated herein by reference.

BACKGROUND OF THE INVENTION

1. Field of the Invention

The present invention relates to equipment and a method for molding a semiconductor device. More particularly, the present invention relates to a mold die for molding a chip array, molding equipment including the same, and a method for molding a chip array.

2. Description of the Related Art

Molding processes are typically used for sealing semiconductor chips after wire-bonding has been completed, by encapsulating the chips and the bonding wires with a chemical resin. The molding process is typically performed in a mold die, which is incorporated into a larger molding apparatus. A typical mold die comprises a pot for holding the mold resin, a cavity block for defining one or more cavities, a paddle, a runner block, and a gate block for defining and controlling a gate through which the resin may enter a cavity. A typical molding apparatus may include 2, 4, 6, or more separate cavity blocks symmetrically disposed in a mold die and connected to a common pot through one or more runner blocks and gate blocks.

Molding processes can be broadly categorized into single molding processes and chip-array molding processes, depending on the number of semiconductor chips loaded in one cavity block. While only a single semiconductor chip is loaded in each cavity in a single molding process, a plurality of semiconductor chips are loaded to form a matrix in each cavity in a chip-array molding process. Since a chip-array molding process typically requires a greater amount of mold resin than a single molding process, the mold die gate for single molding processes may be relatively narrow, while the mold die gate for chip-array molding process will tend to be considerably wider to increase the rate at which the mold resin enters the cavity.

Chip-array molding processes, which are highly productive and which can be much more economical than a single molding processes, are widely used. Chip-array molding processes are typically utilized more frequently in conjunction with certain packaging methods, such as multi-chip package (MCP) and system in package (SIP) configurations, but as the demand for chip-scale packages (CSP) increases, chip-array molding processes are becoming more widely used.

FIG. 1A shows a schematic arrangement of a cavity and a gate of a conventional mold die for molding a chip array with FIG. 1B illustrating a cross-sectional view taken along line I-I' of FIG. 1A.

Referring to FIGS. 1A and 1B, a mold die for molding a chip array includes a cavity block 100 and a gate block 110. Although not shown in the drawings, a runner block is typically disposed adjacent the gate block 110 for defining a resin flow path between the pot and the gate block A recessed surface is provided in the cavity block 100 to define the cavity 105 that will be filled with mold resin that flows from the pot, through the runner block and through the gate 115 during the molding process. A plurality of semiconductor chips 12 on which the wire-bonding process has been completed may be arranged in cavity 105. The semiconductor chips 12 may be attached to, for example, a printed circuit board (PCB) or other suitable substrate 10. In a typical mold die for molding a chip array, a regular array of, for example, four, six, or nine semiconductor chips are attached and wire-bonded to a printed circuit board 10 using conventional assembly processes before being placed in the cavity 105.

As shown in FIG. 1A, the gate 115 of the gate block 110 included in the mold die for molding a semiconductor array has a width only slightly less than the width of a side of the cavity 105 to allow the cavity to be filled more easily with mold resin before the mold resin is hardened. FIGS. 2A through 2D illustrate a series of sequential images from a simulation of mold resin filling a cavity of a conventional mold die for molding a chip array having an arrangement of a cavity 105 and a gate 115 as illustrated in FIG. 1A.

Referring to FIGS. 2A through 2D, as the mold resin, which is entering the cavity 105 at a substantially constant rate, meets a first semiconductor chip 12 disposed in the first row, its flow is impeded by the front surface of the semiconductor chip. In other words, the mold resin starts to flow more slowly at a portion where a semiconductor chip 12 is disposed (see FIGS. 2B and 2D) within the cavity 105 and tends to separate and flow around the semiconductor chip.

FIG. 3 is a diagram of a unit chip of a chip array indicating in more detail the general direction of the flow(s) of the mold resin as it fills the cavity of FIG. 1A. As illustrated in FIG. 3, the semiconductor chips 12 may be a type of multi-chip package (MCP) having an upper semiconductor chip 12a and a lower semiconductor chip 12b. The semiconductor chips and/or the substrate typically include bonding pads 16 and wire-bonding terminals 18 with bonding wires 20 providing electrical connection between designated bond pads and terminals.

As illustrated in FIG. 3, when mold resin is injected perpendicularly to one side of the semiconductor chip 12, the resin will slow as it meets the front side chip surface and will begin to flow around the lateral sides of the chip. Thus, while the mold resin flows past the lateral side of the semiconductor chip 12 at a relatively high rate, its flow past the front side is at a relatively low rate. This results in a flow of the mold resin bypassing the entire semiconductor chip 12 or, in a case of a stack-type multi-chip package (MCP), the entire upper semiconductor chip 12a. Mold resin that has bypassed the semiconductor chip(s) and reached a portion of the cavity where no semiconductor chip 12 is disposed starts again to flow again in all directions at the same rate. As a result, the bypass flow of the mold resin around both lateral sides of the semiconductor chip 12 tend to meet at a rear central region A of the semiconductor chip 12.

In a typical molding process, a sweeping phenomenon occurs. That is, the bonding wires 20 tend to be displaced in the flow direction due to the friction of flow of mold resin flowing past the bonding wire. The sweeping phenomenon is inevitable as mold resin flows past bonding wires with the sweeping force being generally proportional to the length and orientation of the bonding wires exposed to the flow.

However, in semiconductor packages, such as MCP and SIP, where a plurality of semiconductor chips are assembled, the length of the bonding wires 20 tends to increase. As the length of the bonding wires 20 increases, the sweeping forces tend to become more severe and the occurrence of failures increases. Accordingly, when an MCP or SIP is used, the position, spacing and orientation of the bonding wires should be designed with consideration of the sweeping phenomenon in order to provide increased resistance to such failures. Then, as long as the sweeping forces are generally within the limits anticipated by the design, shorts between adjacent wires and the resultant failures will be reduced.

Unlike cases in which the sweeping forces are applied in only one direction, the chip-array molding process must typically be carried out with sweeping forces applied in a plurality of directions while still accommodating demanding requirements for the positioning of bonding wires, the pitch between adjacent bonding wires, and the like. As described above with regard to FIG. 3, the mold resin flowing along both sides of the semiconductor chip 12 will tend to meet behind the rear side of the semiconductor chip 12. As a result, on the rear side of the semiconductor chip 12, bonding wires 20 on either side of region A are swept in opposite directions that tend to force the bonding wires toward each other.

Accordingly, if the positioning of the bonding wires and the pitch between wires are designed with consideration of sweeping forces that are applied in only one direction, the bonding wires, when swept in opposite directions, may be forced into contact with each other near the region A, thus causing a short. In particular, because the length of bonding wires is relatively large in MCP and SIP mounting techniques, the risk of such wire shorts may be increased relative to other package configurations.

To prevent the formation of such shorts, the positions of wires may be changed or the pitch between the wires may be increased. However, as these remedial methods must be incorporated into the layout and a fabrication process of an integrated circuit, they are difficult and complicated to achieve while still maintaining the desired device dimensions.

SUMMARY OF THE INVENTION

The present invention provides an improved mold die which enables flows of mold resin to meet in one corner of a semiconductor chip in a chip-array molding process and molding equipment including such a mold die.

The present invention also provides a mold die for molding a chip array, molding equipment including the such a mold die, and a method for molding a chip array using such a mold die that will tend to reduce the likelihood of shorts between bonding wires near those regions in which opposing flows of mold resin meet.

According to an exemplary embodiment of the present invention, there is provided a mold die for molding a chip array, which comprises a cavity block for defining a cavity, which is a space designed to be filled with mold resin, and a gate block for defining a gate, through which mold resin is injected into the cavity block during the molding process. The gate block in the exemplary embodiment is positioned in a corner of the cavity block so that the mold resin starts to fill the cavity from the corner of the cavity. Accordingly, flows of mold resin injected via the corner gate will meet in a region adjacent a rear corner of a semiconductor chip.

The gate configuration and sizing should be sufficient for introducing a volume of mold resin into a mold die for molding a chip array and molding equipment including the same at a rate that will fill the cavity substantially completely while the mold resin remains in its flowable state and allow a plurality of semiconductor chips to be simultaneously molded. Also, although generally discussed as unitary elements, both the cavity block and the gate block may be formed as single elements or may be assembled from a plurality of differently configured structural elements to produce a final desired shape.

According to another exemplary embodiment of the present invention, there is provided a mold die for molding a chip array, the mold die comprising a cavity block for defining a rectangular cavity, that is a space configured to be filled with mold resin, and a gate block for defining a gate through which mold resin may be injected into the cavity provided in the cavity block. The gate block may be positioned in a corner of the cavity block and may be configured as a straight element, an L-shaped element or may assume a more complex shape. Thus, when the gate block is moved to open the gate, a volume of mold resin will flows into the cavity from one corner of the rectangular cavity and proceed to fill the entire cavity.

In an exemplary embodiment, the gate is configured to cooperate with predetermined portions of two sides adjacent the designated corner of the cavity and produce an opening having a predetermined width. This predetermined width may be equal to or more than one-half of the length of a shorter side of the rectangular cavity and less than the length of a longer side thereof. Also, the gate may be symmetric with respect to the corner of the cavity, particularly when used in cooperation with a square cavity.

According to a third exemplary embodiment of the present invention, there is a chip-array mold die, which comprises a cavity block for defining a cavity, which is a space configured to be filled with mold resin and has a rectangular shape having cut corners, and a gate block for defining a gate, through which mold resin may be injected into the cavity block. Here, the gate block may be positioned in a cut corner of the cavity and may be configured to correspond simply to the cut corner of the cavity or to include both a portion of a cut corner and portions corresponding to portions of the cavity walls adjacent the cut corner to define an opening of predetermined width.

According to a fourth exemplary embodiment of the present invention, there is provided a molding apparatus that includes a mold die for molding a chip array, which may include one or more mold dies configured in accord with the exemplary embodiments of the invention described herein.

According to a fifth exemplary embodiment of the present invention, there is provided a method for molding a chip array, in which mold resin is injected in a manner such that flows of mold resin injected into a cavity tend to meet at a region of the semiconductor chip where bonding wires are not attached or where the spacing of the bonding wires is well above the design minimums.

The exemplary method for molding a semiconductor chip may be utilized in chip-array molding process with the mold resin being injected into a corner of a cavity containing a plurality of semiconductor chips.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF EXEMPLARY EMBODIMENTS

Figure 1A:
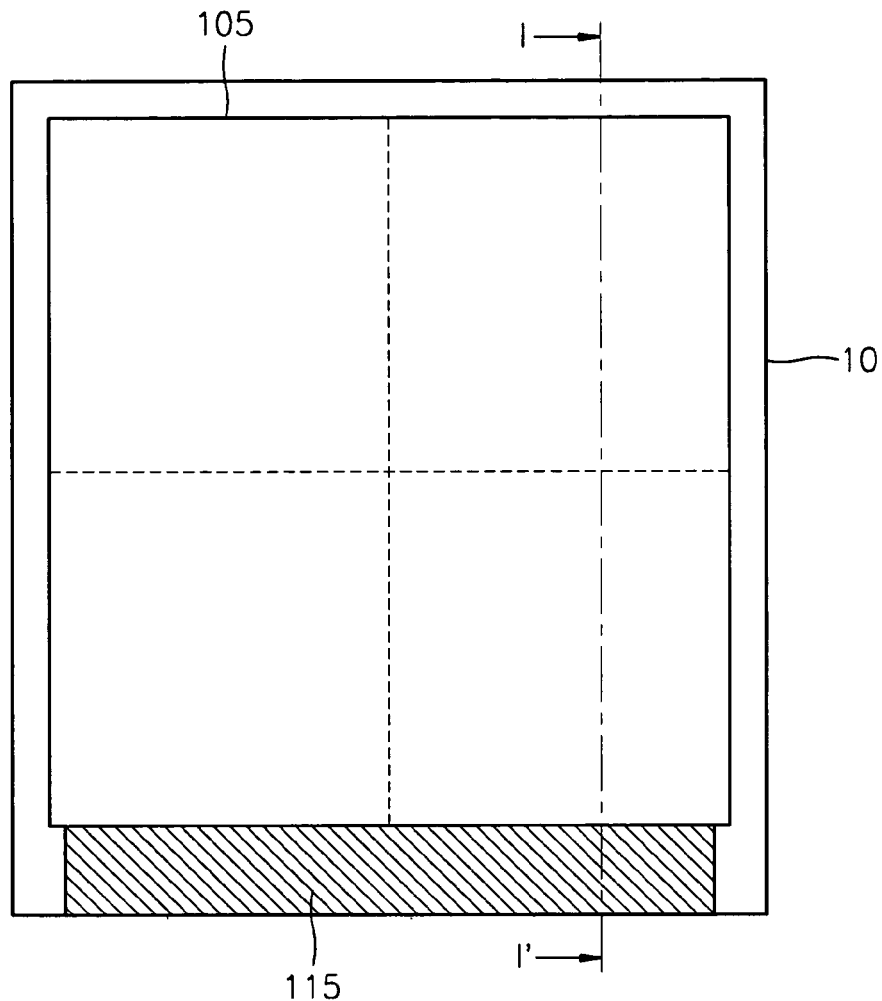
FIG. 1A shows a conventional arrangement of a cavity and a gate of a conventional mold die for molding a chip array.
Figure 1B:
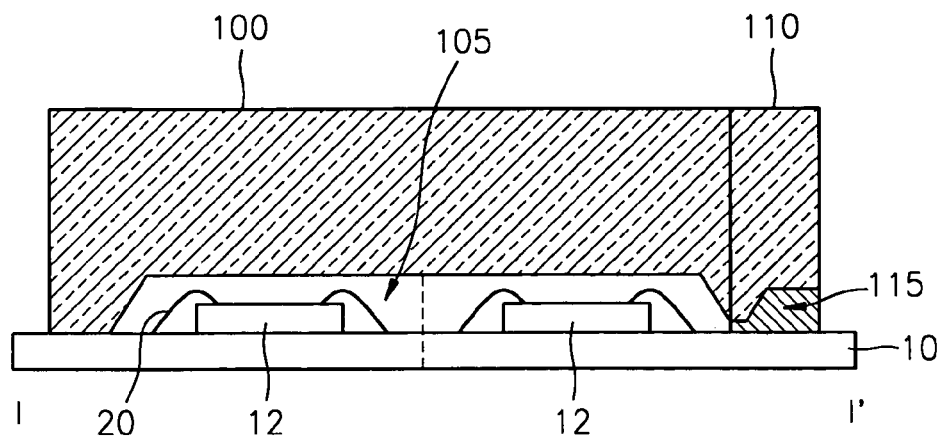
FIG. 1B is a cross-sectional view taken along line I-I' of FIG. 1A.
Figure 2A:
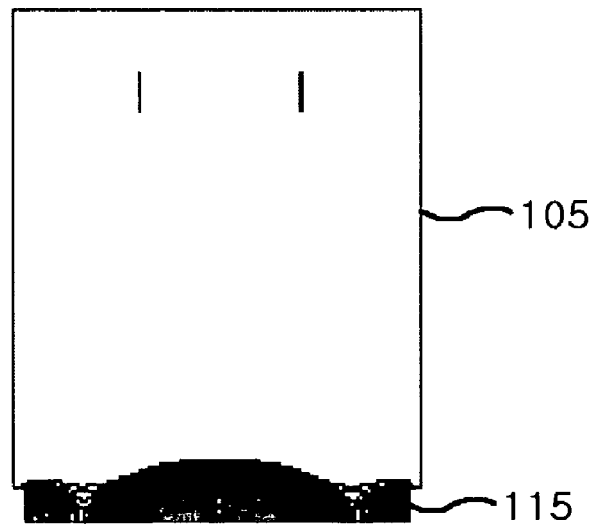
FIGS. 2A through 2D show the sequential flow of mold resin filling a cavity of a conventional mold die during the molding of a chip array.
Figure 2B:
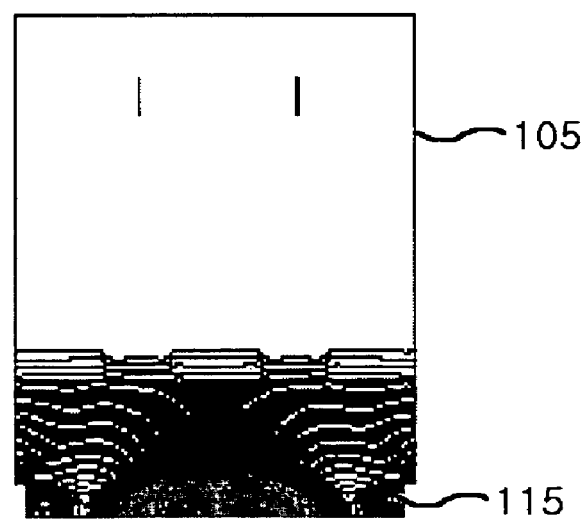
Figure 2C:
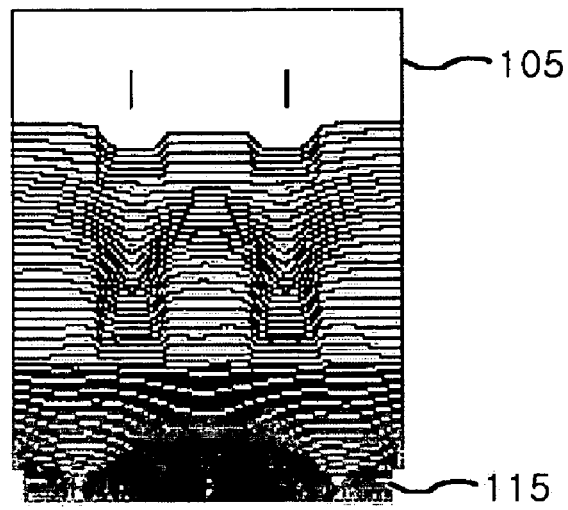
Figure 2D:
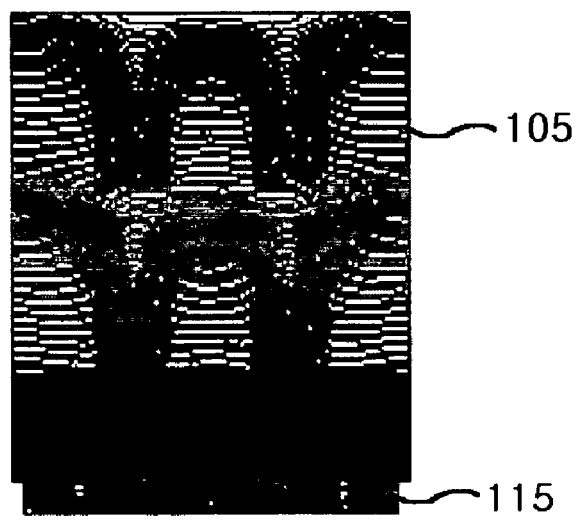
Figure 3:
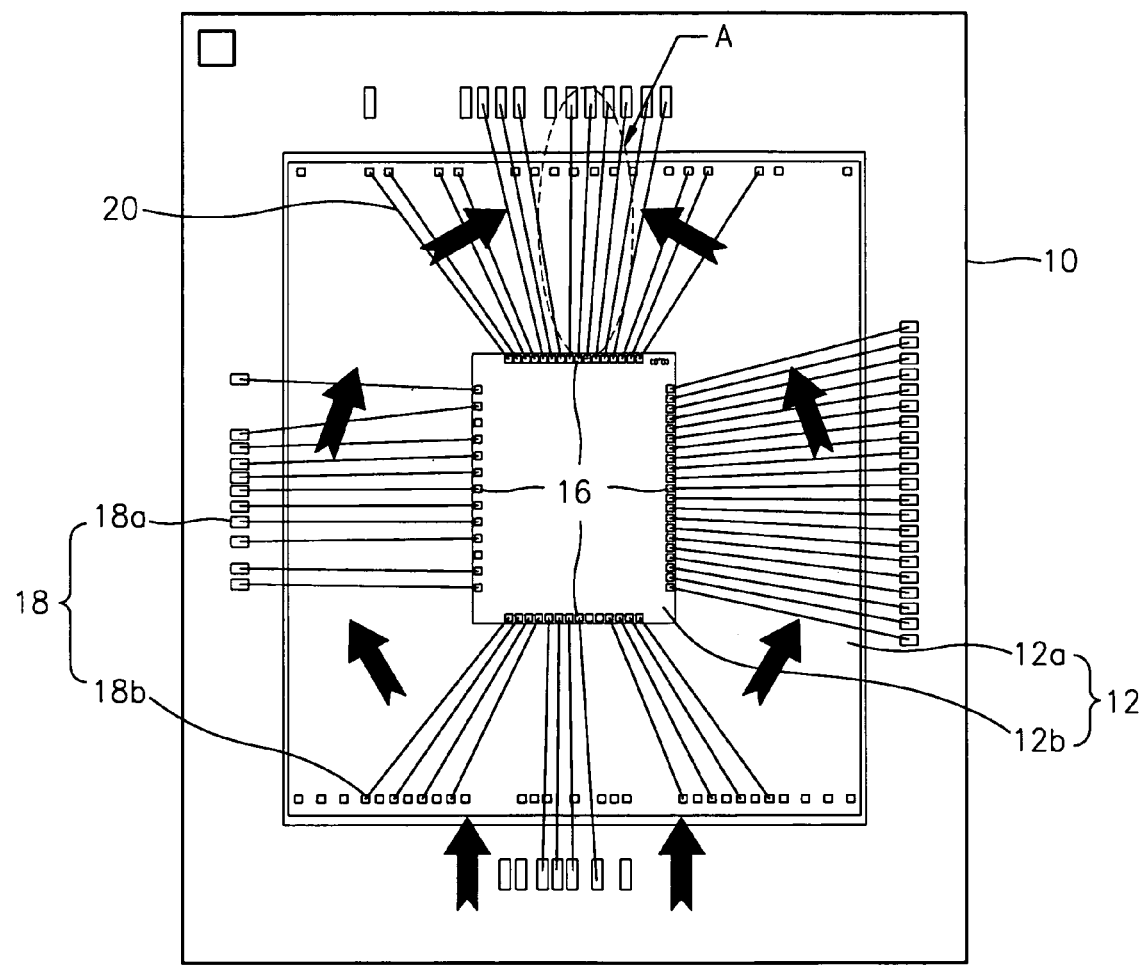
FIG. 3 is a diagram of a unit chip of the chip array showing the flow of mold resin around the chip filling the cavity of FIG. 1A.

Exemplary embodiments of the present invention will now be described more fully with reference to the accompanying drawings, in which representative embodiments of the invention are shown. This invention may, however, be embodied in many different forms and should not be construed as being limited to the specific embodiments set forth herein. Rather, these embodiments are provided so that this disclosure is thorough and complete and fully conveys the concept of the invention to those skilled in the art. In the drawings, which are not to scale, the shape of elements may be exaggerated for clarity, and the same reference numerals in different drawings identifying corresponding elements.

Figure 4A:
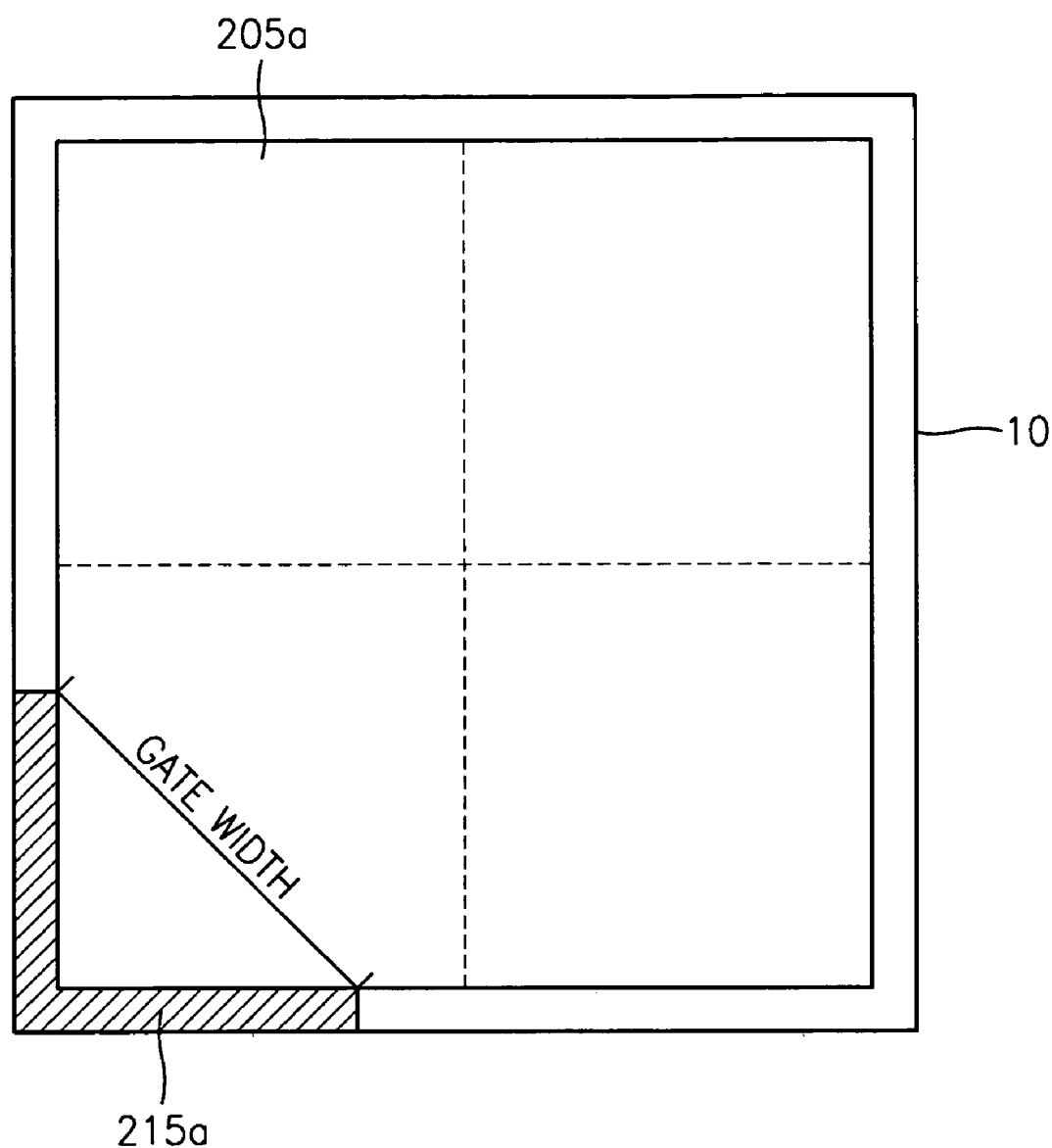
FIGS. 4A-C illustrate exemplary arrangements of a cavity and a gate of a mold die for molding a chip array according to embodiments of the present invention.
Figure 4B:
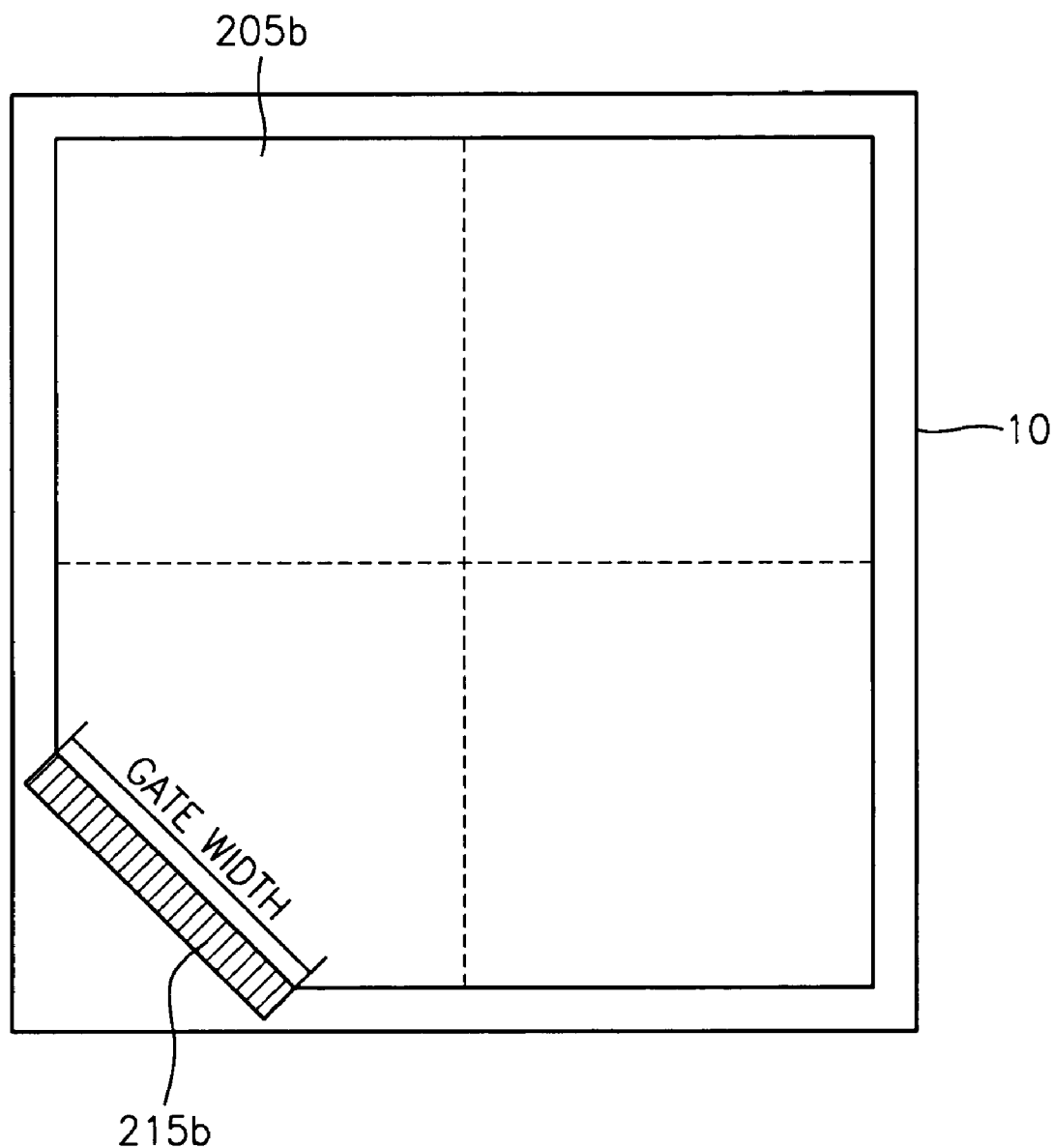
Figure 4C:
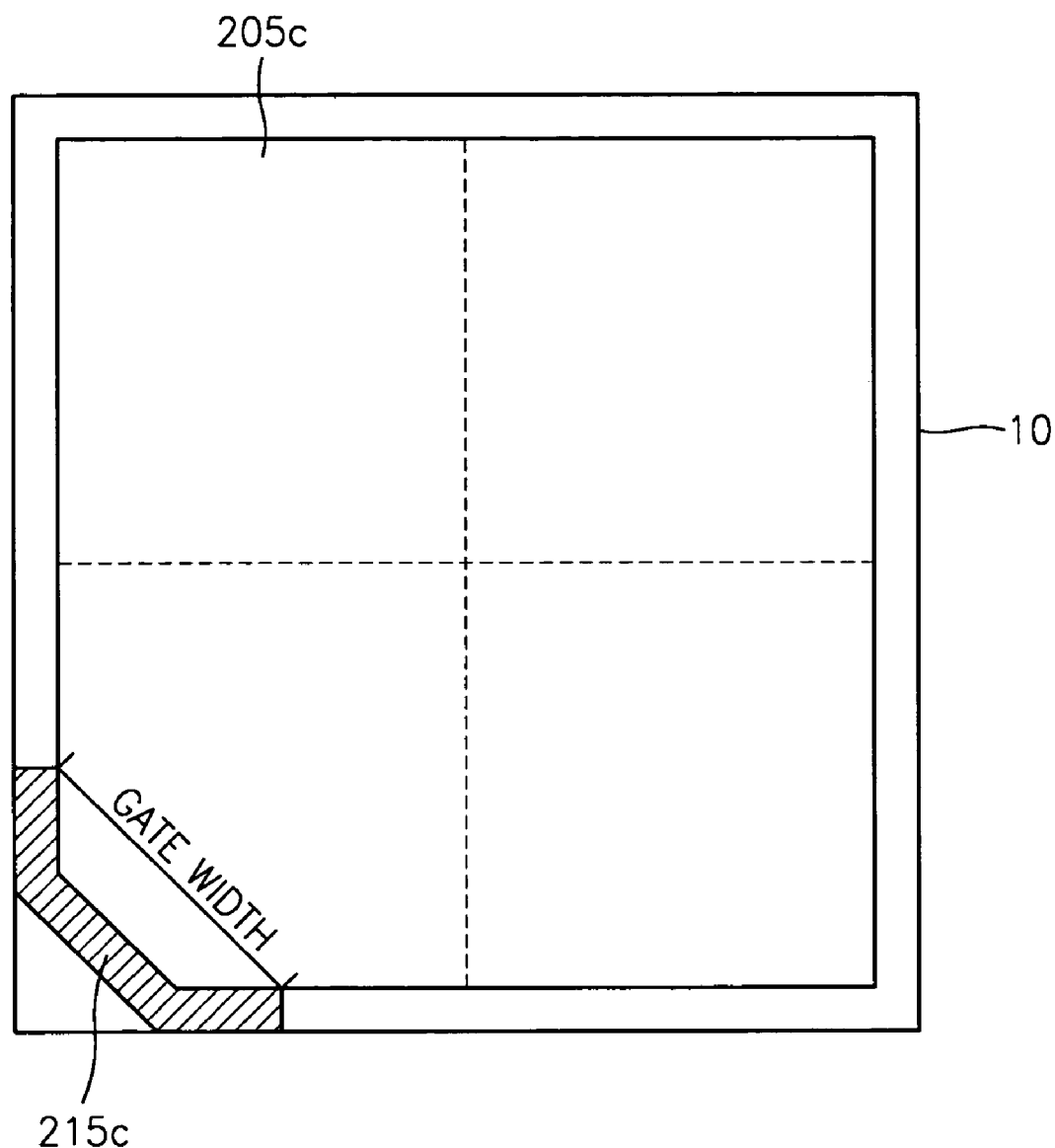

FIGS. 4A-C illustrate exemplary arrangements of the cavity and the gate of a mold die useful for molding a chip array according to the exemplary embodiments of the present invention. The mold die for molding a chip array according to the embodiments of the present invention comprises a cavity block and a gate block. Although not shown in the drawings, the mold die further comprises a pot and a runner block.

Referring to FIGS. 4A-4C cavities 205a, 205b, and 205c are arranged above a substrate 10 and are associated with gates 215a, 215b, and 215c, respectively, with the gates being arranged in one corner of the cavities. The gates 215a, 215b, and 215c, that control an opening through which mold resin may be injected into the corresponding cavity, have a predetermined width. Cavity blocks (not shown) for defining the cavities 205a, 205b, and 205c and gate blocks (not shown) for defining the gates 215a, 215b, and 215c may be constructed as a single element or may be assembled from multiple components to achieve the desired final configuration. The use of multiple components may also allow for the use of various materials having different properties for improving the performance, durability, manufacturability, or other aspect of the blocks over that which could be achieved with a single integral block.

Hereinafter, exemplary embodiments of the present invention will be described in detail with reference to the drawings. Referring to FIG. 4A, the cavity 205a has a rectangular shape and the gate 215a is disposed in one corner of the rectangular cavity 205a and is generally L-shaped. Although illustrated with rectangular elements for convenience, the gate 215a is not limited to an L-shape and can have different shapes and similarly the cavity 205a is not limited to a rectangular shape and may assume more complex configurations. Such configurations may include, for example, sidewalls defining one or more arcs having a constant or variable radius of curvature, combinations of curved and straight sidewalls, or generally straight sidewalls defining a geometric shape other than a rectangle.

In those instances in which the cavity 205a has a rectangular shape, the width of the gate 215a may be equal to or greater than one half of the length of the shorter side of the rectangular cavity 205a. Also, the width of the gate 215a is preferably less than the length of a longer side of the rectangular cavity 205a. In a case where the cavity 205a has a square shape, the shape of the gate 215a may be symmetric with respect to a vertex of the square cavity 215a.

Referring to the exemplary embodiment illustrated in FIG. 4B, the cavity 205b has a generally rectangular shape having one cut corner. The gate 215b has a straight-line shape corresponding to the cut corner. Also, in this exemplary embodiment, the gate 215b has a predetermined width that will allow a sufficient quantity of mold resin to be injected into and substantially fill the cavity while the mold resin remains flowable.

Next, referring to FIG. 4C, like FIG. 4B, the cavity 205c has a generally rectangular shape having one cut corner. However, the shape of the gate 215c represents a combination of the features of both gate 215a of FIG. 4A and gate 215b of FIG. 4B in that gate 215c is not straight, but assumes a more complex configuration with portions aligned with the sides of the cavity at a predetermined angle. In some instances for example, with gate configuration as illustrated in the exemplary embodiment shown in FIG. 4B, the sizing of gate 215b cannot be enlarged sufficiently to permit the necessary volume of resin into the cavity during the required molding period without incurring a negative impact on the configuration of the resulting semiconductor device package(s). In such instances, however, the configuration illustrated as gate 215c in FIG. 4C can be used to remedy such concerns and increase the effective size of the gate. That is, the gate 215c of the third exemplary embodiment includes not only a "cut corner" portion but also includes portions corresponding to the sides of the cavity adjacent the cut corner.

Figure 5:
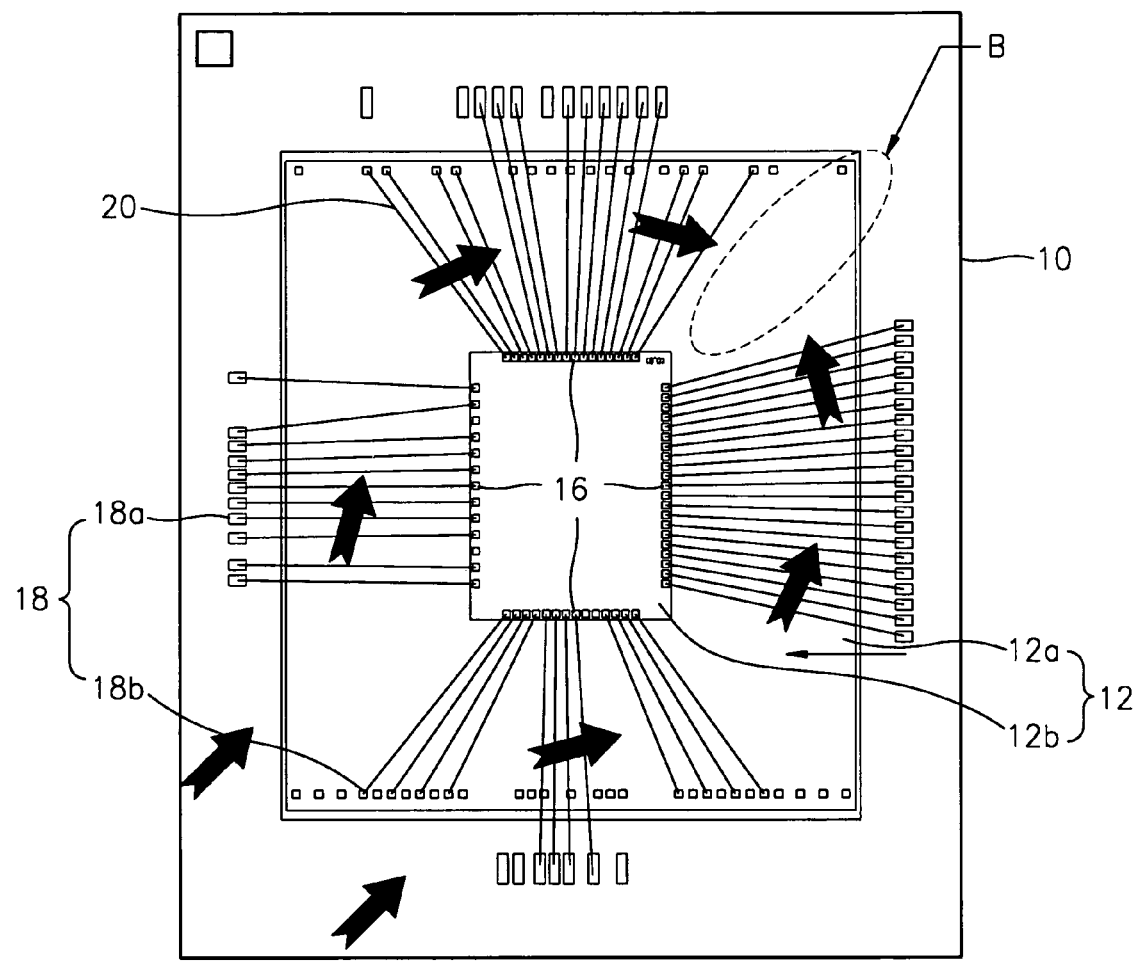
FIG. 5 is a diagram of a unit chip showing the flow of mold resin around the chip filling the cavity of a mold die as exemplified in FIGS. 4A-C.
Figure 6A:
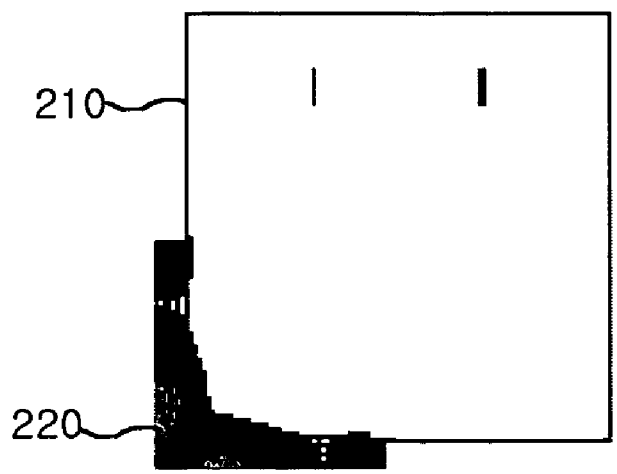
FIGS. 6A through 6D show the sequential flow of mold resin filling the cavity of the mold die of FIG. 4A during the molding of a chip array.
Figure 6B:
Figure 6C:
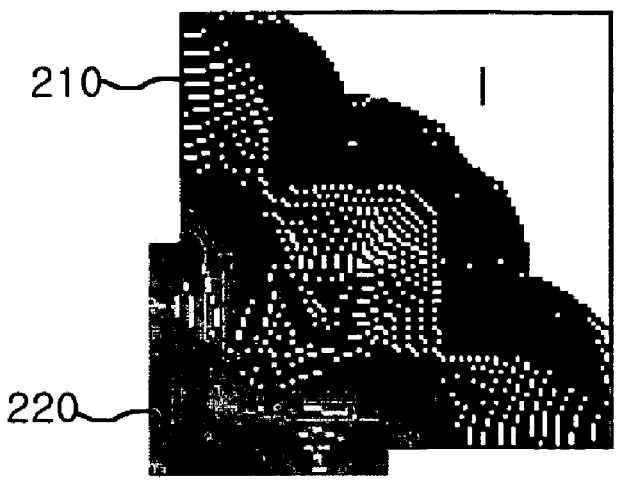
Figure 6D:
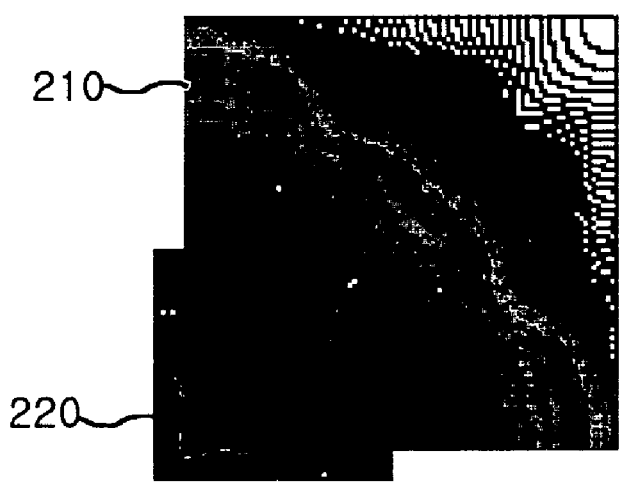

FIG. 5 is a diagram of a unit chip of a chip array indicating in more detail the general direction of the flow(s) of the mold resin as it fills the cavity of the mold die illustrated in FIGS. 4A through 4C. Referring to FIG. 5, when mold resin is injected into the cavity and flowing in a direction diagonal to side surfaces the semiconductor chip 12 meets a forward corner of the lower semiconductor chip 12b and/or the upper semiconductor chip 12a, it separates to flow around both sides of the chip(s). As a result, the separated flows of the mold resin tend to meet at a region near the rear corner of the semiconductor chip 12 opposite the forward corner. In FIG. 5, the arrows denote the flows of the mold resin and reference character B denotes a region where the flows of the mold resin will tend to meet.

FIGS. 6A through 6D show sequential flows of mold resin filling a cavity of a mold die corresponding to FIG. 4A. As illustrated in FIGS. 6A-D the separated flows of mold resin meet in a diagonal direction relative to rectangular cavity 210 and the chip orientation.

Figure 7:
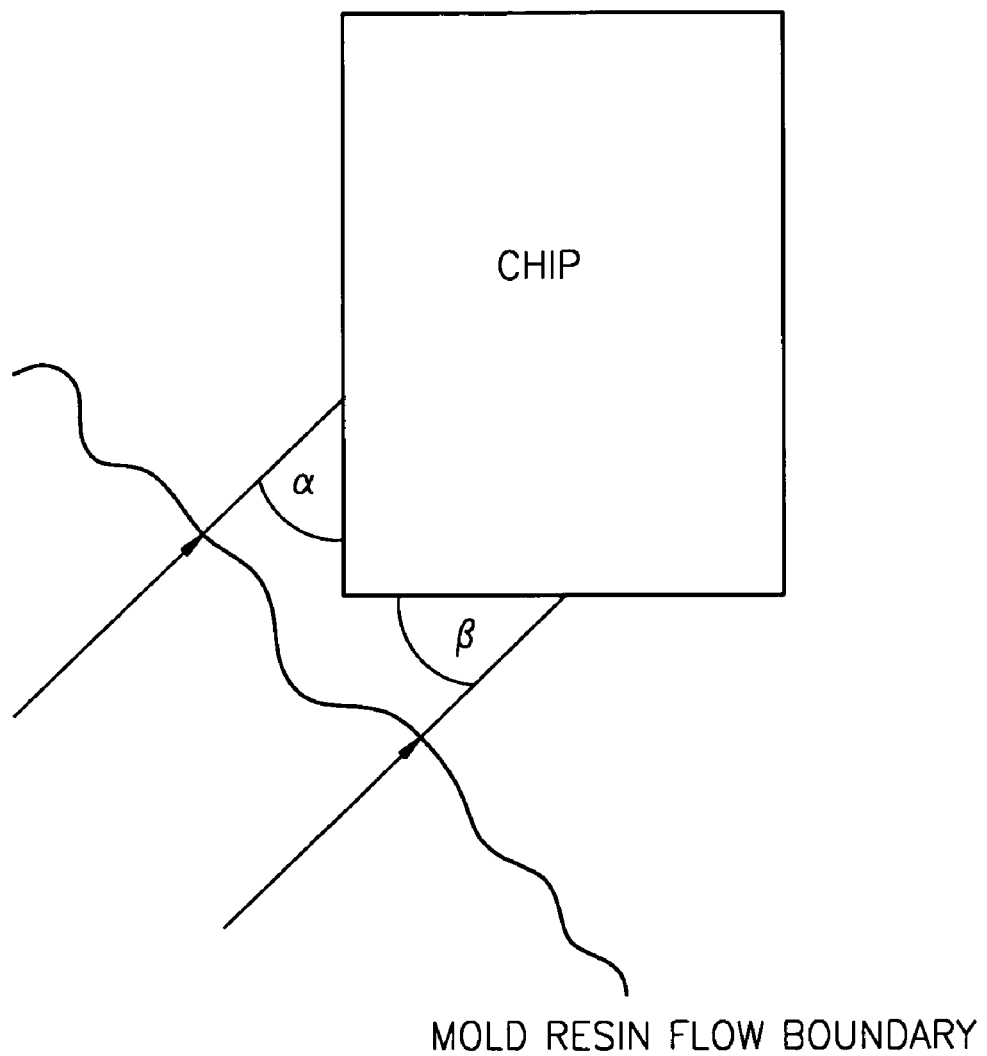
FIG. 7 illustrates the angles formed between the direction of the flow of the mold resin and adjacent sides of a unit chip.

As illustrated in FIG. 7, the flow of the molding resin will form angles $\alpha$ and $\beta$ with adjacent side surfaces of the chip. By relocating the entry point of the mold resin into the cavity of the mold die relative to the orientation of the chip, the angles $\alpha$ and $\beta$ may be selected to be less than about 70°. The angles $\alpha$ and $\beta$ may be selected to be approximately equal, or there may be selected to have a difference of up to about 50° between the two angles, and thereby provide some control over the location and orientation of region B as illustrated in FIG. 5.

The exemplary embodiments of the present invention may be used in combination with a semiconductor chip package in which there are no bonding wires or there are a reduced number of bonding wires arranged near one or more corners of a semiconductor chip thereby increasing the effective pitch of bonding wires that may be exposed to sweeping forces that would tend to force them together. Thus, even if flows of mold resin meet in a corner of a semiconductor chip, bonding wire sweeping effects are less likely to cause shorts. In particular, a method and equipment for molding a chip array according to the exemplary embodiments of the present invention can be applied to package configurations including MCP, SIP and CSP.

According to the exemplary embodiments of the present invention, flows of mold resin surrounding a chip are directed so that they will meet near a corner of the semiconductor chip in a chip-array molding process. Accordingly, since the concentration of bonding wires is high in these regions, opposing flows of mold resin are avoided along the sides of the semiconductor chip where the pitch between bonding wires will tend to be shorter.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A mold die for molding a semiconductor device package, comprising:
    a cavity block, the cavity block comprising a concave surface defining a cavity in which a semiconductor chip may be positioned, the semiconductor chip being generally rectangular and comprising a top surface, bottom surface, and four side surfaces;
    a gate, the gate defining a mold resin entry into the cavity and having a gate width; and
    a gate block arranged and configured for movement relative to the cavity block to provide selective opening and closing of the gate;
    wherein the gate is arranged relative to the semiconductor chip whereby mold resin entering the cavity through the gate will contact two closest side surfaces of the semiconductor chip, flowing substantially parallel to the top and bottom surfaces, at an angle of less than about 70°.

2. A mold die for molding a semiconductor device package according to claim 1, wherein:
    the cavity defined in the cavity block is substantially rectangular and comprises side walls; and
    the semiconductor chip is oriented with the side surfaces generally parallel to closest side walls of the cavity.

3. A mold die for molding a semiconductor device package according to claim 1, wherein:
    the cavity defined in the cavity block comprises four side wall segments and three corners defining a first portion of a cavity perimeter;
    the semiconductor chip is oriented with the side surfaces generally parallel to the closest side wall segments; and
    the gate block, when closed, forms a second portion of the cavity perimeter.

4. The mold die for molding a semiconductor device package according to claim 1, wherein:
    a cavity perimeter is substantially rectangular when the gate is closed by the gate block.

5. The mold die for molding a semiconductor device package according to claim 3, wherein:
    the gate block comprises an internal surface that provides the second portion of the cavity perimeter, the internal surface being positioned between a first side wall segment and a second side wall segment defined by the cavity block, and
    the internal surface comprises an inclined portion that is not parallel to the first or second side wall segments.

6. The mold die for molding a semiconductor device package according to claim 5, wherein the internal surface further comprises:
    a first portion that is substantially parallel to the first side wall segment and a second portion that is substantially parallel to the second side wall segment.

7. The mold die for molding a semiconductor device package according to claim 5, wherein:
    the internal surface is substantially identical to the inclined portion of the internal surface, and
    the gate width is substantially identical to a length of the inclined portion.

8. The mold die for molding a semiconductor device package according to claim 5, wherein:
    a third side wall segment is positioned opposite and generally parallel to the first side wall segment, the third side wall segment being longer than the first side wall segment;
    a fourth side wall segment is positioned opposite and generally parallel to the second side wall segment, the fourth side wall segment being longer than the second side wall segment; and
    the gate width is at least equal to one-half of a first length and is less than a second length, wherein the first length is equal to the shorter of the third and fourth side wall segments and the second length is equal to the longer of the third and fourth side wall segments.

9. The mold die for molding a semiconductor device package according to claim 8, wherein:
    the internal surface is symmetric about an axis extending from a corner of the cavity opposite the gate and extending through a center of the cavity.

10. A mold die for molding a chip array package, comprising:
    a plurality of semiconductor chips;
    a cavity block, the cavity block comprising a concave surface defining a cavity in which the plurality of semiconductor chips may be positioned, the plurality of semiconductor chips being generally rectangular and comprising a top surface, bottom surface, and four side surfaces;
    a gate, the gate defining a mold resin entry into the cavity and having a gate width; and
    a gate block arranged and configured for movement relative to the cavity block to provide selective opening and closing of the gate;
    wherein the gate is arranged relative to the plurality of semiconductor chips whereby mold resin entering the cavity through the gate will contact two closest side surfaces of the plurality of semiconductor chips, flowing substantially parallel to the top and bottom surfaces, at an angle of less than about 70°.

11. A mold die for molding a chip array package according to claim 10, wherein:
    at least two of the plurality of semiconductor chips are arranged in a stacked orientation with bonding wires providing electrical connection between an upper semiconductor chip and a lower semiconductor chip.

12. A molding apparatus for molding a chip array, comprising:
    a mold die according to claim 1, wherein the cavity is arranged and configured to receive a plurality of aligned semiconductor chips comprising side surfaces, and wherein the gate is arranged and configured so that mold resin entering the cavity through the gate will approach the side surfaces;
    a pot for maintaining mold resin; and
    a channel block defining a fluid path between the pot and the gate block.

13. A molding apparatus for molding a plurality of chip arrays, comprising:
a plurality of mold dies according to claim 1;
a pot for maintaining mold resin; and
a channel block defining a plurality of fluid paths between the pot and the plurality of mold dies.

14. A method for molding a semiconductor device package using a mold die according to claim 1, comprising:
arranging a semiconductor chip within the cavity, the semiconductor chip comprising side surfaces;
moving the gate block to open the gate;
injecting a flow of mold resin into the cavity through the gate to fill the cavity;
moving the gate block to close the gate;
solidifying the mold resin within the cavity to form the semiconductor device package; and
removing the semiconductor device package from the cavity;
wherein the gate is configured and positioned such that the flow of mold resin approaches two closest side surfaces of the semiconductor chip at an angle of less than 90°.

15. A method for molding a semiconductor device package using a mold die according to claim 1, comprising:
arranging a semiconductor chip within the cavity, the semiconductor chip comprising side surfaces and a plurality of bonding wires arranged adjacent to the side surfaces for providing electrical connection between the semiconductor chip and a substrate;
moving the gate block to open the gate;
injecting a flow of mold resin into the cavity through the gate to fill the cavity;
moving the gate block to close the gate;
solidifying the mold resin within the cavity to form the semiconductor device package; and
removing the semiconductor device package from the cavity,
wherein the gate is configured and positioned such that the mold resin flows past all bonding wires adjacent to a single side surface of the semiconductor chip in a generally uniform direction.

16. A method for molding a semiconductor device package using a mold die according to claim 15, comprising:
arranging a semiconductor chip within the cavity, the semiconductor chip comprising side surfaces and a plurality of bonding wires arranged adjacent to the side surfaces for providing electrical connection between the semiconductor chip and a substrate, wherein the bonding wires are arranged so as to provide a region of low bonding wire density adjacent to a first corner of the semiconductor chip;
wherein the gate is configured and positioned such that the mold resin separates into two flows as the mold resin reaches a second corner of the semiconductor chip, the second corner being located diagonally across the semiconductor chip from the first corner, the two mold resin flows recombining near the region of low bonding wire density.

17. A mold die for molding a semiconductor device package, comprising:
a cavity block, the cavity block comprising a concave surface defining a cavity in which a semiconductor chip may be positioned, the semiconductor chip being generally rectangular and comprising a top surface, bottom surface, and four side surfaces;
a gate, the gate defining a mold resin entry into the cavity and having a gate width; and
a gate block arranged and configured for movement relative to the cavity block to provide selective opening and closing of the gate;
wherein the gate is arranged relative to the semiconductor chip whereby mold resin entering the cavity through the gate will contact two closest side surfaces of the semiconductor chip at an angle of less than about 70°, measured in a plane substantially parallel to the top and bottom surfaces.

18. A mold die for molding a chip array package, comprising:
a plurality of semiconductor chips;
a cavity block, the cavity block comprising a concave surface defining a cavity in which the plurality of semiconductor chips may be positioned, the plurality of semiconductor chips being generally rectangular and comprising a top surface, bottom surface, and four side surfaces;
a gate, the gate defining a mold resin entry into the cavity and having a gate width; and
a gate block arranged and configured for movement relative to the cavity block to provide selective opening and closing of the gate;
wherein the gate is arranged relative to the plurality of semiconductor chips whereby mold resin entering the cavity through the gate will contact two closest side surfaces of the plurality of semiconductor chips at an angle of less than about 70°, measured in a plane substantially parallel to the top and bottom surfaces.

* * * * *